(12) United States Patent
Lee et al.

(10) Patent No.: US 7,678,676 B2
(45) Date of Patent: Mar. 16, 2010

(54) METHOD FOR FABRICATING SEMICONDUCTOR DEVICE WITH RECESS GATE

(75) Inventors: Hae-Jung Lee, Gyeonggi-do (KR);
Jae-Seon Yu, Gyeonggi-do (KR);
Jae-Kyun Lee, Gyeonggi-do (KR);
Sang-Rok Oh, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/346,811

(22) Filed: Dec. 30, 2008

(65) Prior Publication Data
US 2010/0015775 A1      Jan. 21, 2010

(30) Foreign Application Priority Data
Jul. 15, 2008    (KR)  ............... 10-2008-0068691

(51) Int. Cl.
*H01L 21/00*   (2006.01)
(52) U.S. Cl. .................. 438/589; 257/E21.176
(58) Field of Classification Search ......... 438/585–595; 257/E21.176
See application file for complete search history.

(56) References Cited

U.S. PATENT DOCUMENTS

| | | | | |
|---|---|---|---|---|
| 6,812,120 B1 * | 11/2004 | Young et al. | ................ | 438/589 |
| 7,579,265 B2 * | 8/2009 | Jang et al. | ................... | 438/589 |
| 2008/0020557 A1 * | 1/2008 | Lim | .......................... | 438/589 |
| 2009/0203204 A1 * | 8/2009 | Kim et al. | .................. | 438/589 |

* cited by examiner

*Primary Examiner*—Richard A. Booth
(74) *Attorney, Agent, or Firm*—IP & T Law Firm PLC

(57) ABSTRACT

A method for fabricating a semiconductor device with a recess gate includes providing a substrate, forming an isolation layer over the substrate to define an active region, forming mask patterns with a first width opening exposing a region where recess patterns are to be formed, and a second width opening smaller than the first width and exposing the isolation layer, forming a passivation layer along a height difference of the mask patterns, etching the substrate using the passivation layer and the mask patterns as an etch barrier to form recess patterns, removing the passivation layer and the mask patterns, and forming gate patterns protruding from the substrate to fill the recess patterns.

9 Claims, 7 Drawing Sheets

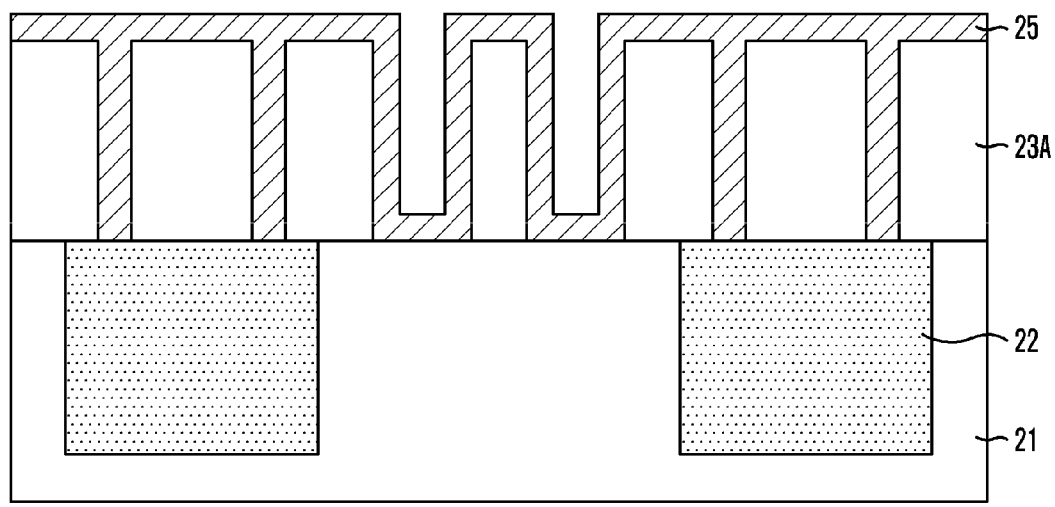
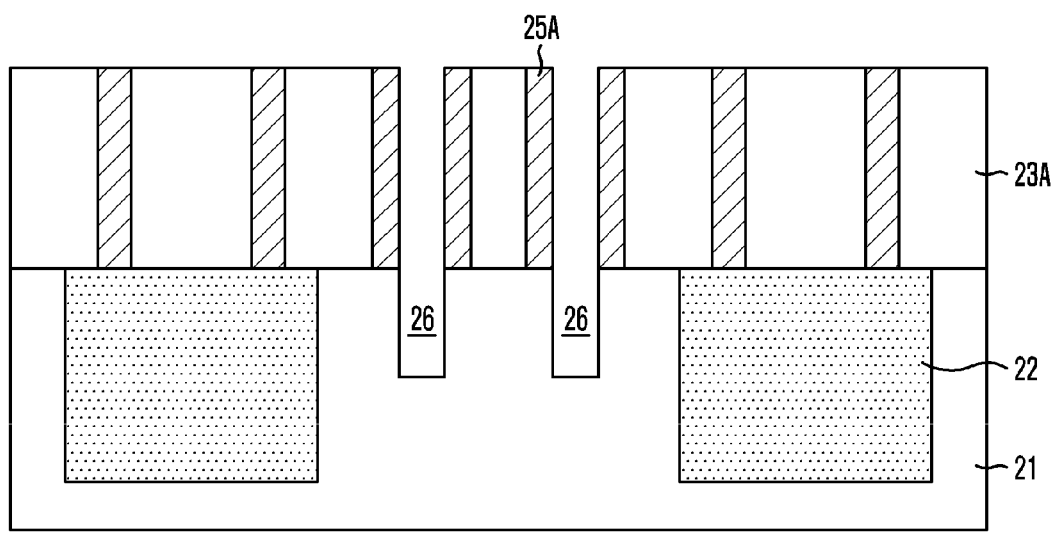

METHOD FOR FABRICATING SEMICONDUCTOR DEVICE WITH RECESS GATE

CROSS-REFERENCE TO RELATED APPLICATIONS

The present invention claims priority from Korean patent application number 2008-0068691, filed on Jul. 15, 2008, which is incorporated by reference in its entirety.

BACKGROUND

The present invention relates to a method for fabricating a semiconductor device, and more particularly, to a method for fabricating a semiconductor device with a recess gate.

As semiconductor devices become more highly integrated, gate channel length increases and ion implant doping concentration decreases. A typical method for forming a gate over a planar active region, that is, a planar gate line formation method, causes electric field to increase. Thus, it is difficult to secure refresh characteristics of the device because of junction leakage caused by the electric field increase.

To secure the refresh characteristics of the semiconductor device, a method for forming a three-dimensional (3D) gate structured recess gate for recessing a region below gate patterns is proposed to increase the channel length.

FIGS. 1A to 1C are cross-sectional views describing a typical method for fabricating a semiconductor device with a recess gate.

Referring to FIG. 1A, an isolation layer 12 is formed over a substrate 11 to define an active region. The isolation layer 12 and the active region are selectively etched to form recess patterns 13.

Referring to FIG. 1B, gate patterns 14 protruding from the substrate 11 are formed to fill the recess patterns 13. The gate patterns 14 may include a stack structure of a first electrode 14A, a second electrode 14B, and a gate hard mask 14C. Herein, a linewidth of the recess patterns 13 in the isolation layer 12 can be increased through a cleaning process performed before the gate patterns 14 are formed.

An etch barrier layer 15 is formed over a resultant structure including the gate patterns 14. An insulation layer 16 is formed to fill the gap between the gate patterns 14.

Referring to FIG. 1C, the insulation layer 16 and the etch barrier layer 15 between the gate patterns 14 are etched to open the substrate 11. A conductive material is filled in the resulting spaces to form a landing plug contact 17.

As described above, in the typical process, the recess patterns 13 and the landing plug contact 17 are formed to improve the refresh characteristics.

According to the typical method, however, an isolation layer 12 can be damaged by the cleaning process performed before the substrate 11 is open and filled with the conductive material. Thus, a short 100 can occur between the gate patterns 14 and the landing plug contact 17.

SUMMARY

Preferred embodiments of the present invention are directed to providing a semiconductor device with a recess gate.

In accordance with an aspect of the present invention, there is provided a method for fabricating a semiconductor device with a recess gate. The method includes providing a substrate, forming an isolation layer over the substrate to define an active region, forming mask patterns with a first width opening exposing a region where recess patterns are to be formed, and with a second width opening, smaller than the first width, exposing the isolation layer, forming a passivation layer along a height difference of the mask patterns, etching the substrate using the passivation layer and the mask patterns as an etch barrier to form recess patterns, removing the passivation layer and the mask patterns, and forming gate patterns protruding from the substrate to fill the recess patterns.

BRIEF DESCRIPTION OF THE DRAWINGS

FIGS. 2A to 2H are cross-sectional views describing a method for fabricating a semiconductor device with a recess gate in accordance with an embodiment of the process of the invention.

DESCRIPTION OF EMBODIMENTS

Figure 1A:
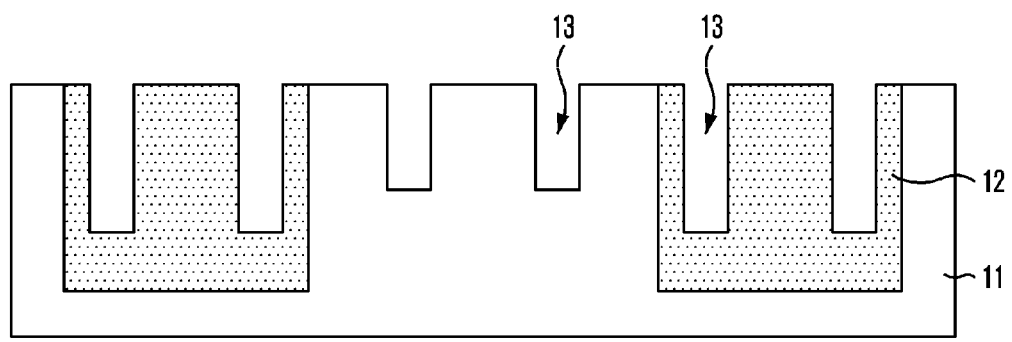
FIGS. 1A to 1C are cross-sectional views describing a typical method for fabricating a semiconductor device with a recess gate.
Figure 1B:
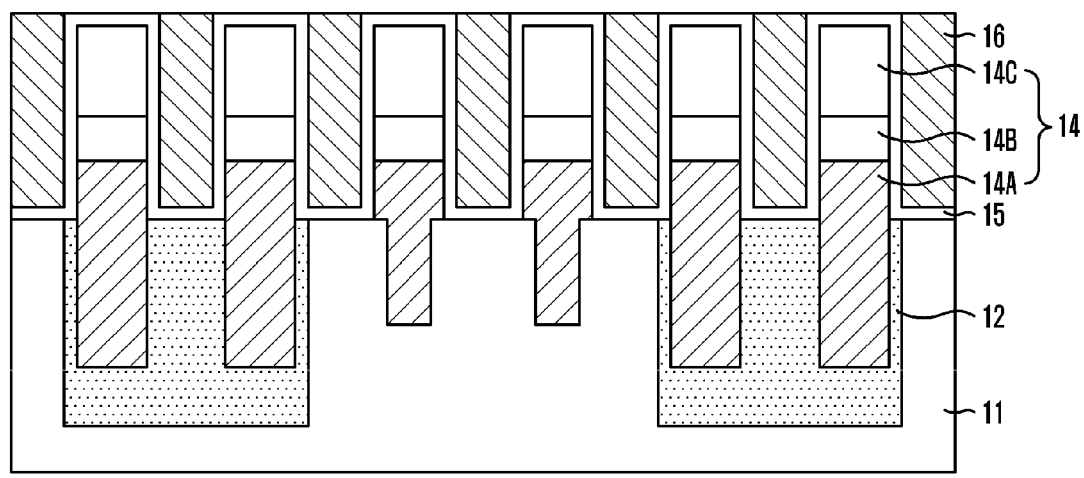
Figure 1C:
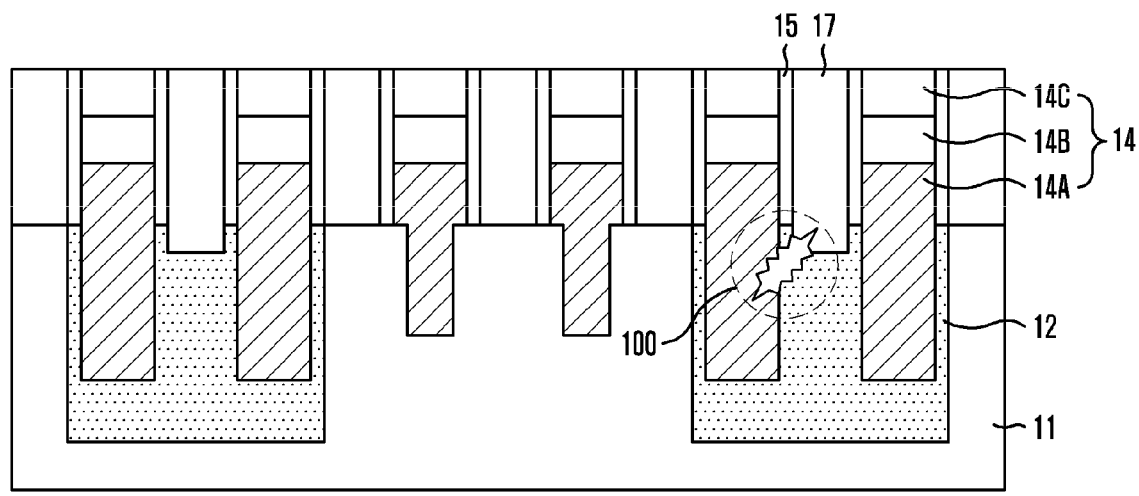

Embodiments of the present invention relate to a method for fabricating a semiconductor device with a recess gate.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals throughout the various embodiments of the present invention represent the same or like elements in different drawings.

FIGS. 2A to 2H are cross-sectional views describing a method for fabricating a semiconductor device with a recess gate in accordance with an embodiment of the present process.

Figure 2A:
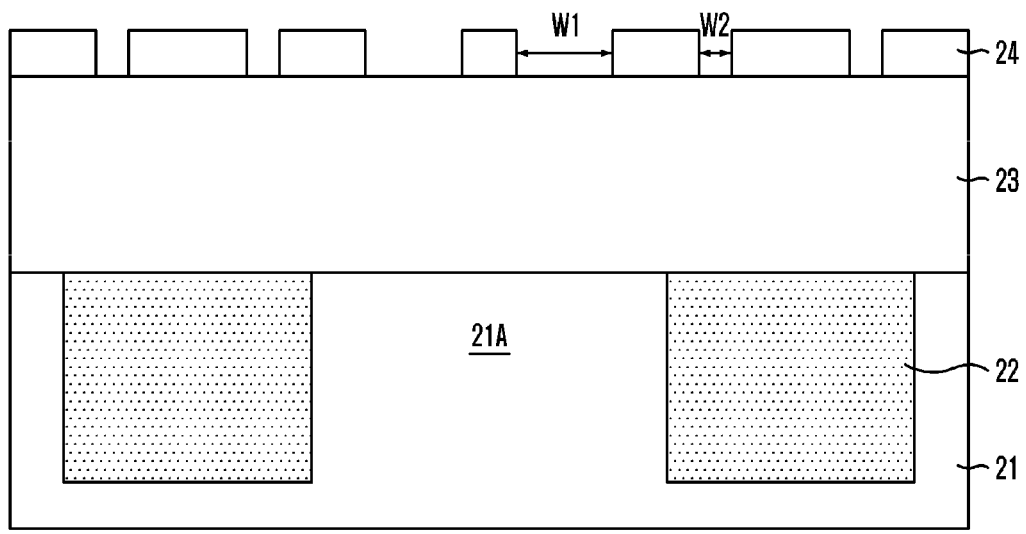

Referring to FIG. 2A, an isolation layer 22 is formed in the substrate 21 to define an active region 21A. The substrate 21 may be a silicon substrate upon which a Dynamic Random Access Memory (DRAM) process is performed. The isolation layer 22 can be formed through a Shallow Trench Isolation (STI) process to define the active region.

Specifically, a pad oxide layer and a pad nitride layer are formed over the substrate 21. A photoresist pattern is formed to define an isolation region. The pad nitride layer and the pad oxide layer are etched using the photoresist pattern as an etch barrier layer. The photoresist pattern is removed and then a portion of the substrate 21 is dry-etched using the pad nitride layer as an etch barrier layer to form a trench. A thermal oxide layer, a liner nitride layer, and a liner oxide layer are sequentially formed and then an insulation layer is formed to fill a trench. A planarization process is performed until a surface of the pad nitride layer is exposed. Lastly, the pad nitride layer is removed. As a result, the isolation layer 22 is formed. The insulation layer filling the trench may include a Spin On Dielectric (SOD) layer to fill the trench. When the insulation layer is the SOD layer, a thermal treatment process can be performed for densification of a layer.

A hard mask layer 23 is formed over the substrate 21 including the isolation layer 22 to secure an etch margin during a subsequent recess pattern formation process. The hard mask layer 23 may have a stack structure of a sacrificial oxide layer, an amorphous carbon layer, and a silicon oxy-nitride layer. Herein, the silicon oxy-nitride layer may be used as an anti-reflection layer.

Photoresist patterns 24 with first and second widths W1 and W2 are formed over the hard mask layer 23 disposed on the active region 21A. The first width W1 exposes a region where the recess patterns are formed. The second width W2 smaller than the first width W1 exposes the hard mask layer 23 disposed the isolation layer 22.

The isolation layer 22 formation process will be described, hereinafter. A photoresist layer is coated over the hard mask layer 23. The photoresist layer is etched to open the region where the recess patterns are formed using photo-exposure and development. Thus, the photoresist patterns 24 are formed.

The photoresist patterns 24 are illustrated in FIG. 4 in detail.

Figure 3:
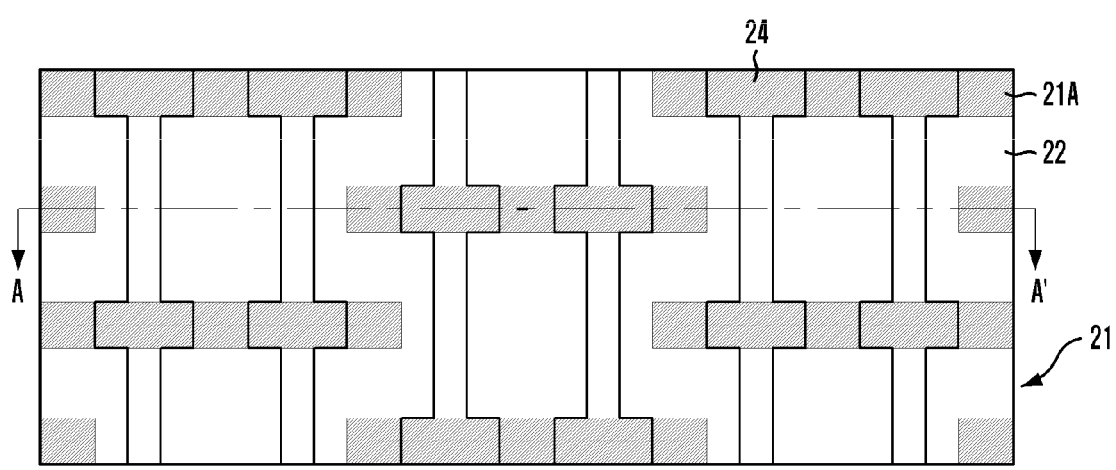
FIG. 3 is a plane view of the photoresist patterns in accordance with an embodiment of the present invention.

FIG. 3 is a plane view of the photoresist patterns in accordance with an embodiment of the present invention.

Referring to FIG. 3, the photoresist patterns are formed to have lines and spacers alternating each other. Particularly, the second width disposed on the isolation layer is smaller than the first width disposed on the active region.

Thus, when a subsequent passivation layer is formed, an upper portion of the isolation layer is completely protected. Thus, it is possible to prevent a loss of the isolation layer during the subsequent recess formation process.

Figure 2B:
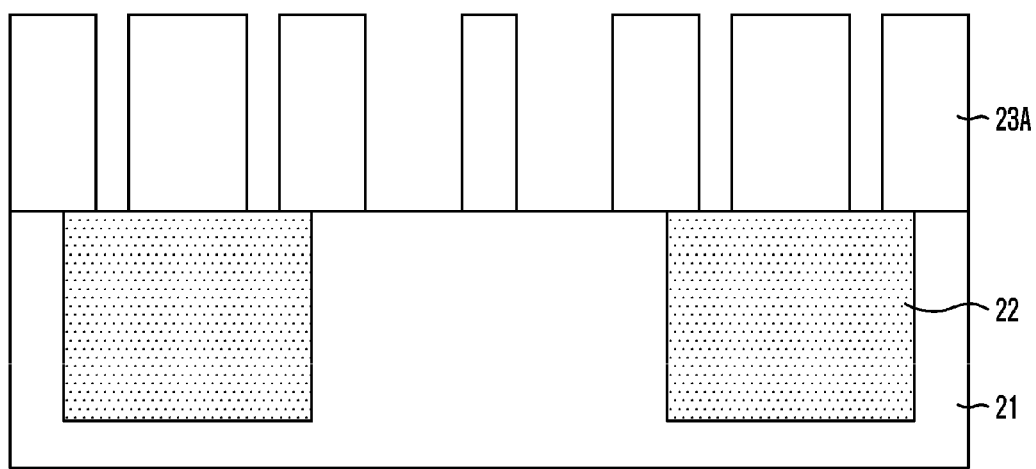

Referring to FIG. 2B, the hard mask layer 23 (refer to FIG. 3A) is etched using the photoresist patterns 24 (refer to FIG. 3A) as an etch barrier. Hereinafter, the etched mask layer 23 becomes the mask patterns 23A. The mask patterns 23A are formed to have first and second widths W1 and W2 having different widths like the photoresist patterns 24.

The photoresist patterns 24 are removed. The photoresist patterns 24 are removed through a dry etch process. The dry etch process is performed through an oxygen removal process.

Referring to FIG. 2C, a passivation layer 25 is formed on the mask patterns 23A. The passivation layer 25 completely fills the second width W2 while not completely filling the first width W1. A thickness of the passivation layer 25 may be changed according to the first and second widths W1 and W2 of the hard mask patterns 23A. To be specific, the passivation layer 25 preferably has a thickness of approximately 40 Å to approximately 200 Å.

The passivation layer 25 is deposited at a temperature under approximately 500° C. to prevent the loss of the isolation layer 22 during a subsequent recess pattern formation process. More specifically, the passivation layer 25 is preferably deposited at a temperature of approximately 30° C. (room temperature) to approximately 500° C. When the mask patterns 23A include amorphous carbon and the passivation layer 25 is deposited at a temperature over approximately 500° C., the mask patterns 23A may peel off.

The passivation layer 25 may be formed of a material having a selectivity ratio with the mask patterns 23A and the substrate 21. For instance, the passivation layer 25 may include a nitride layer or an oxide layer.

In this embodiment, the mask patterns 23A are formed to open the substrate 21. However, in other embodiments, a portion of the mask patterns 23A may be etched to form the passivation layer 25.

Referring to FIG. 2D, the substrate 21 is etched using passivation patterns 25A and mask patterns 23 as an etch barrier to form recess patterns 26. An upper portion of the isolation layer 22 is protected by the mask patterns 23A and the passivation patterns 25A and thus, the isolation layer 22 is not damaged.

Before the substrate 21 is etched, a blanket etch process may be performed on the passivation layer 25 (refer to FIG. 3C) disposed on the substrate 21. Thus, the passivation layer 25 (refer to FIG. 3C) disposed on the upper portion of the mask patterns 23A and the substrate 21 is etched. The etched passivation layer 25 then becomes the passivation patterns 25A. The passivation patterns 25A remain on sidewalls of the mask patterns 23A in the active region 21A and between the mask patterns 23A disposed on the isolation layer 22.

The mask patterns 23A and the passivation patterns 25A protect the isolation layer 22 from being damaged. The substrate 21 in the active region 21A is selectively etched to form recess patterns 26. The recess patterns 26 are formed to improve refresh characteristics by increasing channel length. In this invention, the recess patterns 26 are formed to have a 'U' shape. However, the recess patterns 26 may be formed to have a polygonal shape instead.

Figure 2E:
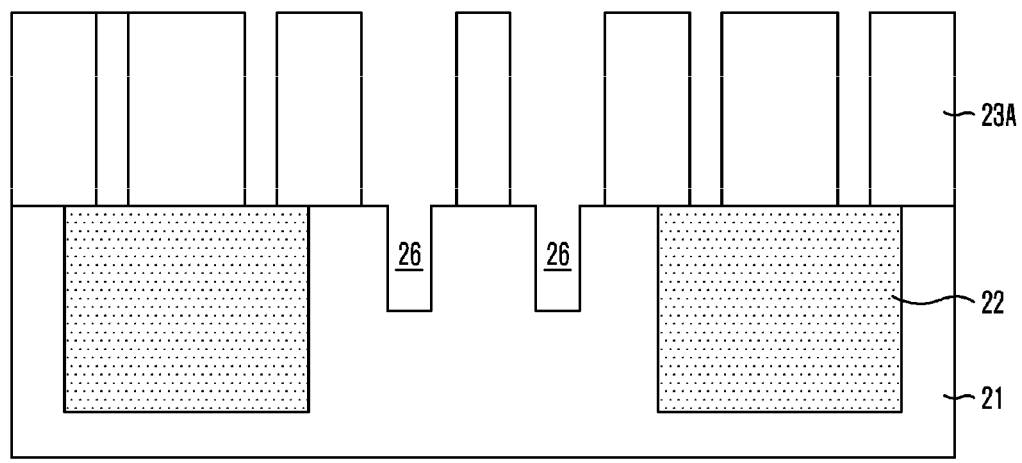

Referring to FIG. 2E, the passivation patterns 25A are removed. The passivation patterns 25A may be removed through a dry or wet etch process. When the passivation patterns 25A include a nitride layer, the wet etch process may be performed using phosphoric acid solution. When the passivation patterns 25A include an oxide layer, the wet etch process may be performed using hydrogen fluoride (HF) solution or Buffered Oxide Etchant (BOE). The dry etch process may be performed using a plasma including fluorine (F).

Figure 2F:
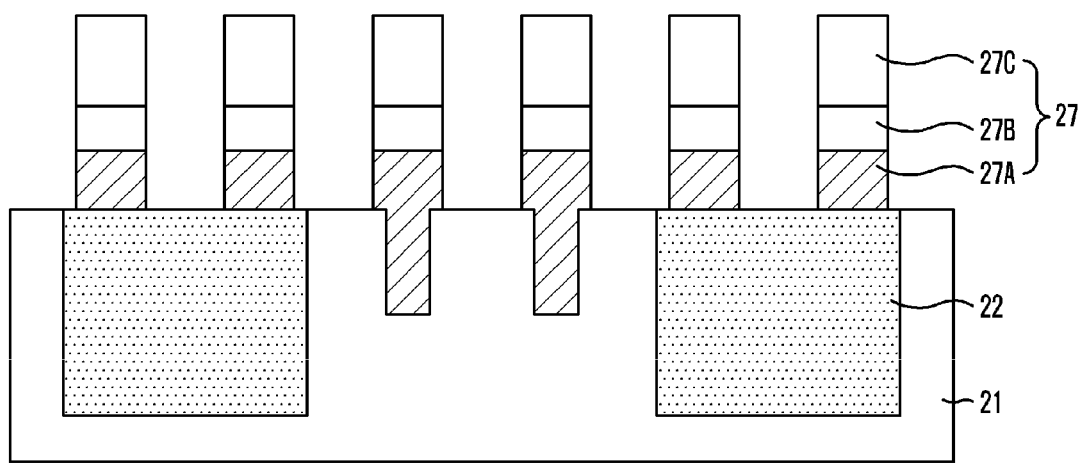

Referring to FIG. 2F, the mask patterns 23A are removed. When the mask patterns 23A include an amorphous carbon, the mask patterns 23A may be removed through an oxygen removal process.

The recess patterns 26 in the active region 21A are filled and then gate patterns 27 protruding from the substrate 21 are formed. The gate patterns 27 may include a stack structure of a first electrode 27A, a second electrode 27B, and a gate hard mask 27C. The first electrode 27A may be a polysilicon electrode. The second electrode 27B may include a metal electrode such as tungsten or tungsten silicide. The gate hard mask 27C may include a nitride layer.

Cleaning and gate insulation formation processes may be performed before the gate patterns 27 are formed. The cleaning process may be a wet cleaning process using the HF solution. The gate insulation layer is used for insulating the gate patterns 27 from the substrate 21 and may include an oxide layer. The oxide layer may include a thermal oxide layer or a plasma oxide layer.

Figure 2G:
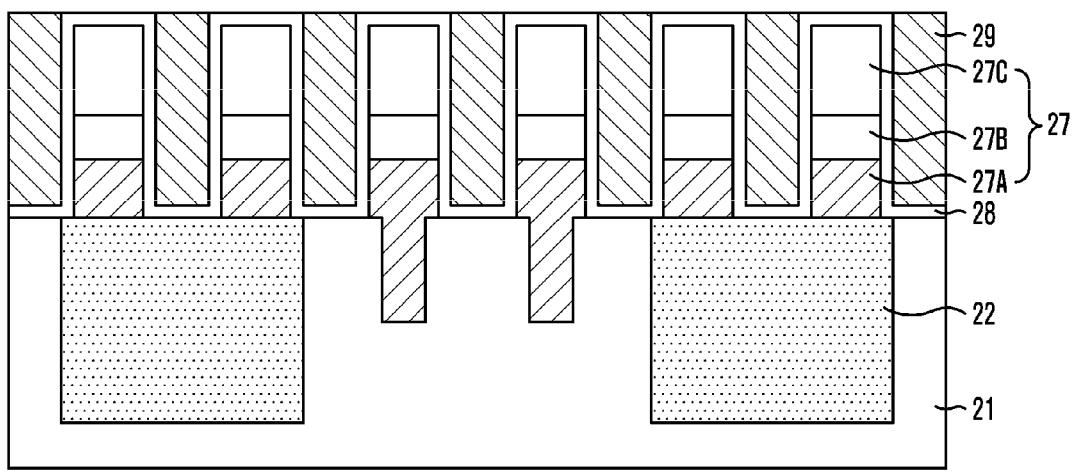

Referring to FIG. 2G, an etch barrier layer 28 is formed over a resultant structure including the gate patterns 27. The etch barrier layer 28 is formed to protect the gate patterns 27 and the substrate 21 during a Self-Aligned Contact (SAC) process for forming a subsequent landing plug contact. The etch barrier layer 28 may include a material having a selectivity ratio with the oxide layer. Preferably, the etch barrier layer 28 may include a nitride layer.

An Inter Layer Dielectric (ILD) layer 29 is formed over the etch barrier layer 28 to fill the gap between the gate patterns 27. The ILD layer 29 is formed to have a thickness higher than that of the gate pattern 27 to sufficiently fill the gap between the gate patterns 27. Then, a surface of the etch barrier layer 28 is planarized through a Chemical Mechanical Polishing (CMP) process.

The oxide layer may be one selected from the group consisting of a High Density Plasma (HDP) oxide layer, a Boron Phosphorus Silicate Glass (BPSG) layer, a Phosphorus Silicate Glass (PSG) layer, a Boron Silicate Glass (BSG) layer, a Tetra Ethyl Ortho Silicate (TEOS) layer, an Un-doped Silicate Glass (USG) layer, a Fluorinated Silicate Glass (FSG) layer, a Carbon Doped Oxide (CDO) layer, and an Organo Silicate Glass (OSG) layer. The oxide layer may include a stack structure of more than two materials listed above. Also, the oxide layer may include a layer coated by a spin coating method like the Spin On Dielectric (SOD) layer. Preferably, the oxide layer may include the SOD layer.

When the ILD layer 29 includes the SOD layer, a thermal treatment process is performed for the densification.

Figure 2H:
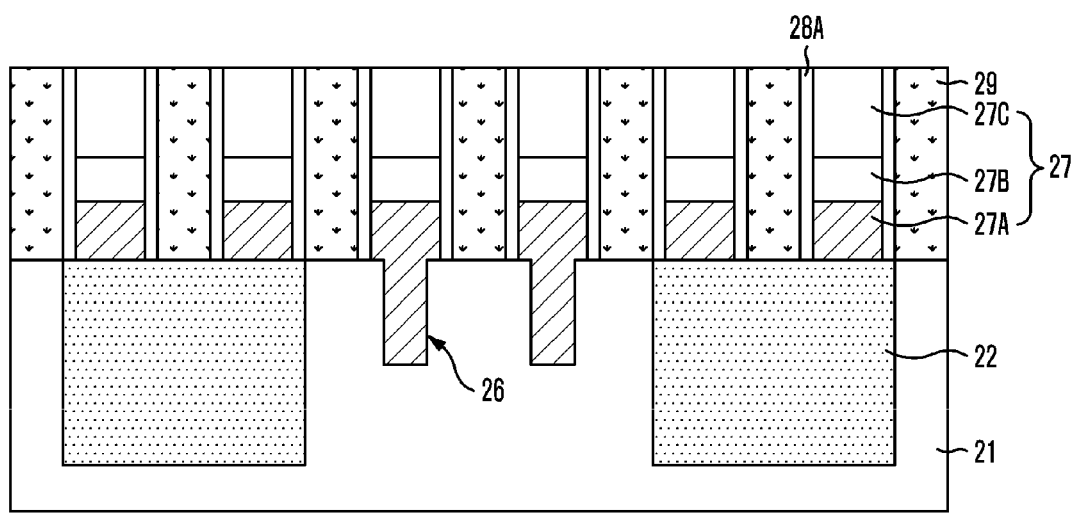

Referring to FIG. 2H, the ILD layer 29 is etched through a Self Aligned Contact (SAC) etch process. In the SAC etch process, the etch process is performed using a selectivity ratio of the oxide layer to the nitride layer to secure a patterning margin corresponding to a high level of integration of the devices.

In the SAC etch process, a resultant structure including the ILD layer 29 is coated with a photoresist layer. The ILD layer 29 is etched to form photoresist patterns. Thus, the landing plug contact region is opened using photo-exposure and development. The ILD layer 29 is etched using the photoresist patterns as an etch barrier. The etch barrier layer 28 disposed on the gate patterns 27 is a nitride layer and the ILD layer 29 is an oxide layer. Thus, the ILD layer 29 may be selectively etched without a loss of the gate patterns 27.

The SAC etch process stops at the etch barrier layer 28. An over-etch process is performed not to leave the ILD layer 29 over the upper portion of the etch barrier layer 28.

A blanket etch process is performed to open the active region in the substrate 21. Before the blanket etch process is performed, the photoresist patterns are removed to perform the SAC etch process.

The blanket etch process may be performed using a nitride layer etch gas. The etch barrier layer 28 disposed on the upper portion of the gate patterns 27 and the substrate 21 is completely etched to open the active region in the substrate 21. The etch barrier layer 28 remains on the sidewalls of the gate patterns 27. The remaining etch barrier layer 28 is called etch barrier patterns 28A.

A cleaning process may be performed. The cleaning process may be a wet cleaning process performed to remove a native oxide layer disposed on the substrate 21 by using the HF solution.

Regions between the gate patterns 27 are filled with a conductive material to form a landing plug contact 30.

The conductive material is formed to have a higher thickness than the gate pattern 27 to sufficiently fill between the gate patterns 27. A planarization process is performed to expose the gate patterns 27. The planarization process may be a Chemical Mechanical Polishing (CMP) process. The conductive material may include a polysilicon.

As described above, when the recess patterns 26 are formed, the isolation layer 22 is protected to prevent the loss is prevented. Thus, a short does not occur between the gate patterns 27 disposed on the isolation layer 22 and the landing plug contact 30.

The method for fabricating the semiconductor device with the recess gate in accordance with the embodiment of the present invention protects the isolation layer not to be damaged during the recess pattern formation process. Furthermore, by avoiding forming the recess patterns over the isolation layer, a short occurring between the gate patterns disposed on the isolation layer and the landing contact plug during the subsequent cleaning process can be prevented.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a semiconductor device with a recess gate, the method comprising:
providing a substrate;
forming an isolation layer over the substrate to define an active region;
forming mask patterns with a first width opening exposing a region where recess patterns are to be formed, and a second width opening smaller than the first width and exposing the isolation layer;
forming a passivation layer on the mask patterns;
etching the substrate using the passivation layer and the mask patterns as an etch barrier to form recess patterns;
removing the passivation layer and the mask patterns; and
forming gate patterns protruding from the substrate to fill the recess patterns.

2. The method of claim 1, wherein a thickness of the passivation layer does not bury the first width of the mask patterns and fills the second width of the mask patterns.

3. The method of claim 1, wherein the passivation layer includes a material having a selectivity ratio with the substrate.

4. The method of claim 1, wherein the passivation layer includes a nitride layer or an oxide layer.

5. The method of claim 1, wherein the passivation layer is formed at a temperature of between 30° C. and 500° C.

6. The method of claim 1, wherein removing the passivation layer is performed through a wet etch process or a dry etch process.

7. The method of claim 6, wherein the wet etch process is performed using phosphoric acid solution when the passivation layer is a nitride layer.

8. The method of claim 6, wherein the dry etch process is performed using a plasma including fluorine (F) when the passivation layer is a nitride layer.

9. The method of claim 6, wherein the wet etch process is performed using hydrogen fluoride (HF) solution or Buffered Oxide Etchant (BOE) when the passivation layer is an oxide layer.

* * * * *